(12) United States Patent
Mii et al.

(10) Patent No.: US 8,678,266 B2
(45) Date of Patent: *Mar. 25, 2014

(54) WIRE BONDING METHOD

(75) Inventors: Tatsunari Mii, Tachikawa (JP);
Toshihiko Toyama, Tokorozawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 1535 days.

This patent is subject to a terminal disclaimer.

(21) Appl. No.: 11/361,640

(22) Filed: Feb. 24, 2006

(65) Prior Publication Data

US 2006/0186177 A1    Aug. 24, 2006

(30) Foreign Application Priority Data

Feb. 24, 2005    (JP) ................................ 2005-048237

(51) Int. Cl.
*B23K 31/02*    (2006.01)
(52) U.S. Cl.
USPC ......... 228/103; 228/104; 228/180.5; 228/4.5; 228/904
(58) Field of Classification Search
USPC ............................................... 228/103, 104
See application file for complete search history.

(56) References Cited

U.S. PATENT DOCUMENTS

| | | | |
|---|---|---|---|
| 4,327,860 A | | 5/1982 | Kirshenboin et al. |
| 4,766,448 A | * | 8/1988 | Hack et al. .................... 347/148 |
| 5,058,797 A | | 10/1991 | Terakado et al. |
| 5,111,989 A | | 5/1992 | Holdgrafer et al. |
| 5,566,876 A | * | 10/1996 | Nishimaki et al. ............ 228/102 |
| 2002/0171155 A1 | * | 11/2002 | Fujihira ........................ 257/780 |

FOREIGN PATENT DOCUMENTS

| | | |
|---|---|---|
| JP | 9-94545 | 4/1995 |
| JP | 11-191564 | 7/1999 |
| JP | 2000-306940 | 11/2000 |
| JP | 2003-347369 | 12/2003 |

OTHER PUBLICATIONS

Computer English Translation of JP2003-347369.*

* cited by examiner

*Primary Examiner* — Erin Saad
(74) *Attorney, Agent, or Firm* — DLA Piper LLP (US)

(57) ABSTRACT

A wire bonding method for bonding a ball 11 which is formed at a tip end of a bonding wire to a pad 2 that is a first bond point to form a first bonding part 12 and bonding the wire 10 to an interconnect wiring 4 that is a second bond point to form a second bonding part, thus connecting the pad 2 and the interconnect wiring with the wire, wherein after the ball is bonded to the first bond point and a capillary 6 is ascended, examination is performed to find any bonding failure of the first bonding part; and when the bonding failure at the first bond point is found, then the capillary is caused to descend to execute bonding to bond the first bonding part to the first bond point.

17 Claims, 5 Drawing Sheets

WIRE BONDING METHOD

BACKGROUND OF THE INVENTION

The present invention relates to a method for executing wire bonding and more particularly to a wire bonding method that involves a countermeasure against bonding failure at a bond point where bonding is made.

Figure 4:
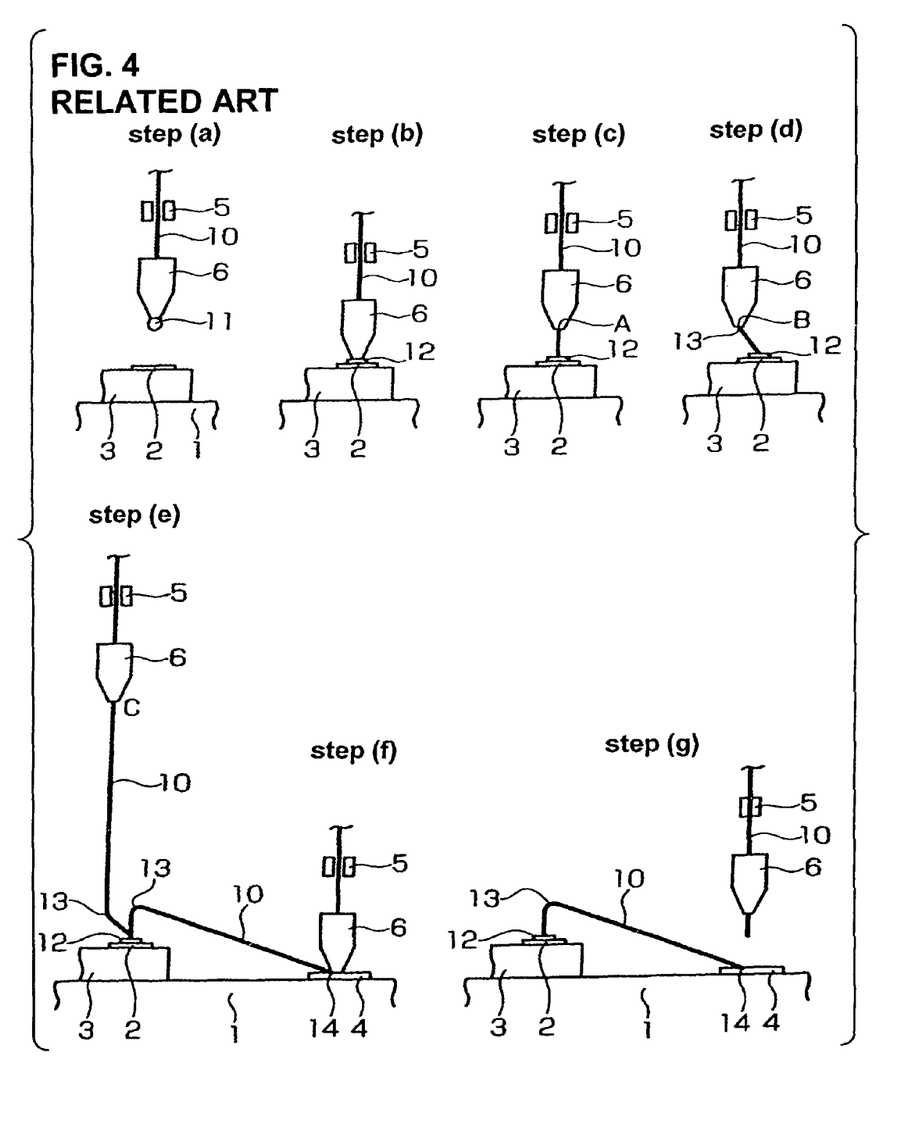
FIG. 4 is a process diagram of a known wire bonding method.
Figure 5:
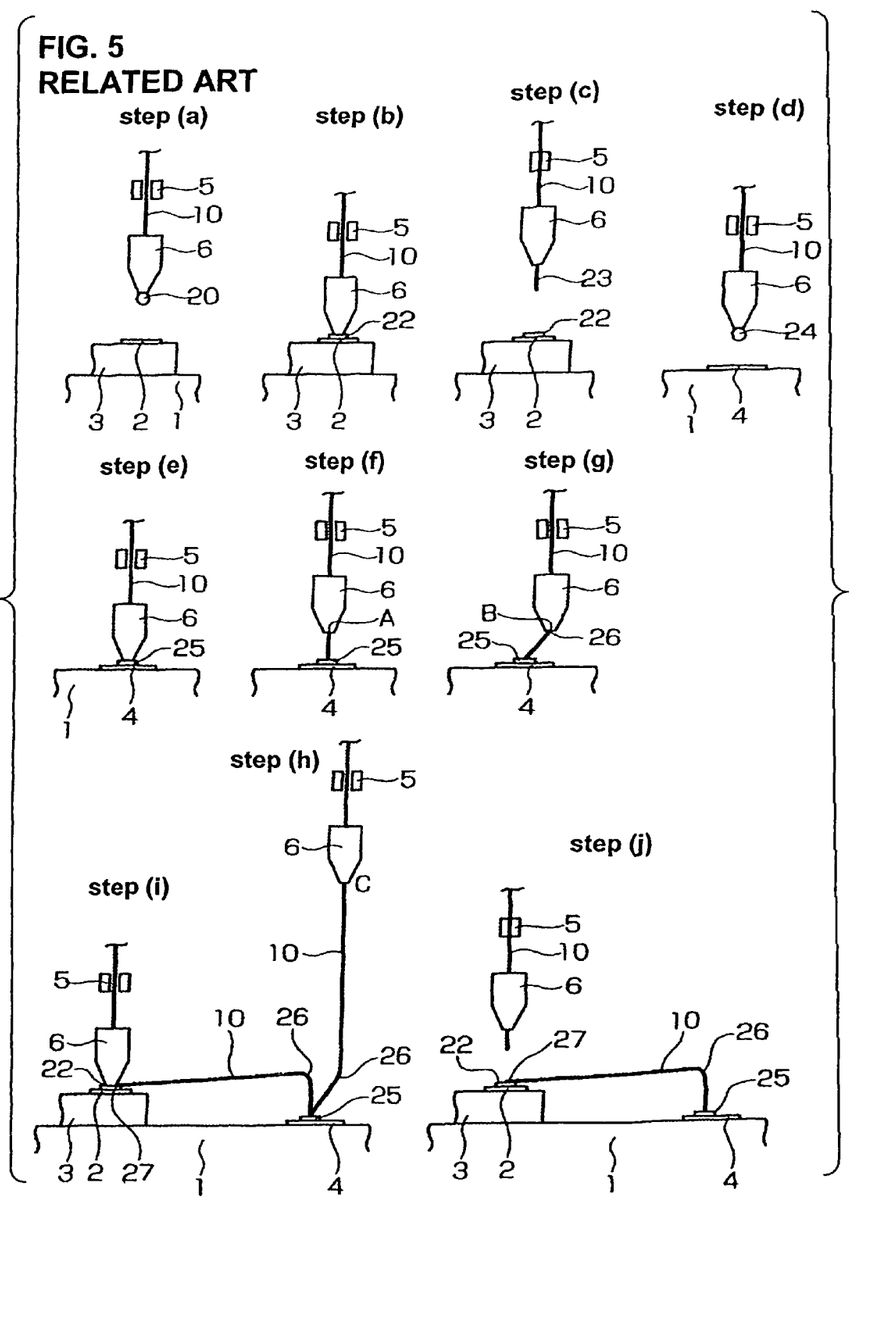
FIG. 5 is a process diagram of another known wire bonding method.

In general, for wire bonding methods for bonding a ball formed at a tip end of a bonding wire (merely called "wire") to a first bond point and then connecting the first bond point to a second bond point with the wire, two methods shown in FIG. 4 and FIG. 5 are used. Also as a typical case, an exemplary wire bonding method can be found in, U.S. Pat. No. 5,111,989, the disclosure which is hereby incorporated by reference. In FIGS. 4 and 5, on a circuit board 1 comprising a ceramic board or print board or lead frame or the like, a die 3 whereon a pad 2 is formed is mounted; and an interconnect wiring 4 is formed on the circuit board 1.

In the first wire bonding method, as shown in FIG. 4, the pad 2 is the first bond point and the interconnect wiring 4 is the second bond point. Since the pad 2 is the first bond point, a ball 11 formed at the tip end of a wire 10 is bonded directly to the pad 2 that is the first bond point.

In the second wire bonding method, as shown in FIG. 5, conversely to that described above, the interconnect wiring 4 is the first bond point, and the pad 2 is the second bond point. In this method, since the pad 2 is the second bond point, a bump 22 is formed beforehand on the pad 2.

The first wire bonding method is first described with reference to FIG. 4.

In step (a), a ball 11 is formed by an electric torch (not shown in the drawings) at the tip end of the wire 10 that passes through a clamper 5 and further passes through a capillary 6, and then the clamper 5 is opened.

Next, in step (b), the capillary 6 descends and bonds the ball 11 to the pad 2 that is the first bond point, thus forming the first bonding part 12.

Next, in step (c), the capillary 6 ascends as far as a reverse starting point A, paying out the wire 10.

Then, in (d), a reverse movement is effected, causing the capillary 6 to move horizontally as far as a bend formation point B in a direction opposite from the interconnect wiring 4 that is the second bond point. As a result, the wire 10 takes on a shape such that it inclines from the first bonding part 12 to the bend formation point B, and a bent part 13 of the wire is formed at the portion of the bend formation point B.

In next step (e), the capillary 6 ascends as far as a loop top point C as it pays out the wire 10.

After the step (e), the capillary 6 is moved in step (f) to directly above the interconnect wiring 4 that is the second bond point, and then it descends and bonds the wire 10 to the interconnect wiring 4 to make a second bonding part 14.

Next, the clamper 5 and capillary 6 ascend together in step (g), the clamper 5 closes during this ascending movement, and the wire 10 is cut at the base of the second bonding part 14.

FIG. 5 shows the second wire bonding method

In this method, in step (a), a ball 20 is formed by an electric torch (not shown) at the tip end of the wire 10, and then the clamper 5 is opened.

In the next step (b), the capillary 6 descends and bonds the ball 20 to the pad 2 that is the second bond point, thus forming a bump 22.

After this step (b), the clamper 5 and capillary 6 ascend in step (c) together with the clamper 5 closed during this ascending movement, and the wire 10 is cut at the base of the bump 22, thus forming the bump 22 on the pad 2, with the tail 23 of the wire 10 left extended out of the capillary 6.

Next, a ball 24 is formed by an electric torch (not shown) in the tail 23 in step (d); and then the clamper 5 is opened, and it is moved above the interconnect wiring 4 that is the first bond point.

In the next step (e), the capillary 6 descends and bonds the ball 24 to the interconnect wiring 4 that is the first bond point, thus forming a first bonding part 25.

The capillary 6 then ascends in step (f) as far as the reverse starting point A, paying out the wire 10.

In step (g), a reverse movement is then effected causing the capillary 6 to move horizontally as far as the bend formation point B in a direction opposite from the pad 2 that is the second bond point. As a result, the wire 10 takes on a shape such that it inclines from the first bonding part 25 to the bend formation point B, and a bent part 26 of the wire is formed at the portion of the bend formation point B.

Next, in step (h), the capillary 6 ascends as far as the loop top point C, paying out the wire 10.

After the step (h), the capillary 6 is moved in step (i) to directly above the pad 2 that is the second bond point; and then the capillary 6 descends and bonds the wire 10 to the pad 2, making the pad a second bonding part 27.

Next, in step (j), the clamper 5 and capillary 6 ascend together, the clamper 5 closes during this ascending movement, cutting the wire 10 at the base of the second bonding part 27.

In the above-described methods, in cases where the joining strength for the first bonding part 12 in the method of FIG. 4 or for the first bonding part 25 in the method of FIG. 5 is insufficient, the first bonding part 12 or 25 may peel away from the pad 2 or the interconnect wiring 4 when the capillary 6 ascends step (c) of FIG. 4 or in step (f) of FIG. 5. Methods for detecting such bonding failure at the first bonding part are disclosed in, for instance, U.S. Pat. No. 5,058,797, Japanese Patent Application Laid-Open (Kokai) Nos. H7-94545 (Japanese Patent No. 3,041,812) and 2003-347369. Please note that exemplary method for detecting bonding failure can be found in U.S. Pat. No. 5,058,797, the disclosure of which is hereby incorporated.

Furthermore, in cases where the joining strength for the bump 22 is insufficient, when the wire 10 is cut during in steps (b) and (c), the bump 22 would peel away from the pad 2 and is raised together with the capillary 6. At least one, U.S. Pat. No. 5,058,797, Japanese Patent Application Laid-Open (Kokai) Nos. 11-191564 and 2000-306940, for instance, disclose methods for detecting such bonding failures at the bump part.

In the related art described above, when a first bonding part non-bonding (bonding failure) or bump part non-bonding (bonding failure) occurs, an abnormality signal is output, and the bonding apparatus is stopped. Since the apparatus will be in a stopped state until a worker arrives to fix the problems, productivity is poor, which is a problem.

BRIEF SUMMARY OF THE INVENTION

Accordingly, the object of the present invention is to provide a wire bonding method that enhances the productivity of wire bonding.

The above-described object is accomplished by a unique process of the present invention for a wire bonding method that includes the steps of:

bonding a ball formed at a tip end of a bonding wire (wire) to a first bond point by causing a capillary to descend to form a first bonding part on the first bond point, and then bonding the wire to a second bond point to form a second bonding part on the second bond point, thus connecting the first bond point and the second bond point with wire;

and in the present invention, the wire bonding method examines, after the ball is bonded to the first bond point and a capillary is ascended, if the first bonding part is bonded to the first bond point, and if it is found that the first bonding part is not bonded to the first bond point, then the capillary is caused again to descend to execute bonding of the non-bonded first bonding part to the first bond point.

The above above-described object is accomplished by a further unique process of the present invention for a wire bonding method for bonding a first bond point which is an interconnect wiring and a second bond point which is a pad, in which the method includes the steps of:

forming a bump beforehand on the second bond point by way of bonding a first ball formed at a tip end of a wire to the second bond point by causing a capillary to descend, bonding a second ball formed at a tip end of a tail of the wire to the first bond point by causing the capillary to descend to form a first bonding part on the first bond point, and then bonding the wire to the bump on the second bond point to form a second bonding part, thus connecting the first bond point and the second bond point with the wire;

and in the present invention, the wire bonding method examines if the bump is bonded to the pad before the wire is cut to form the bump and the capillary is ascended, and if it is detected or found that the bump is not bonded to the pad, then a capillary is caused again to descend to execute boding of the non-bonded bump to the second bond point; and further, examines, after the ball is bonded to the first bond point and the capillary is ascended, if the first bonding part is bonded to the first bond point, and if it is detected or found that that the first bonding part is not bonded to the first bond point, then the capillary is caused again to descend to execute bonding of the non-bonded first bonding part to the first bond point.

In the above-describe methods of the present invention, the above-described examination for non-bonding of the first bonding part is conducted either while the capillary is ascending toward a reverse starting point or when it has ascended to a reverse starting point.

Furthermore, in the present invention, when the examination detects non-bonding of the first bonding part repeatedly, then the wire bonding apparatus executing the method is stopped, so that reworking of bonding can be made on the defective products on which any non-bonding (bonding failure) has been detected and/or removing of the defective products on which any non-bonding (bonding failure) has been detected can be made, preventing unnecessary non-bonding detections.

In the present invention, when the examination detects non-bonding of the bump repeatedly, the wire bonding apparatus executing the method is likewise stopped.

As seen from the above, in the method of the present invention, when a first bonding part non-bonding (bonding failure) is detected, instead of stopping the bonding apparatus, the capillary is again caused to descend to bond the non-bonded first bonding part to the first bond point. Accordingly, the productivity is high.

In addition, in the present invention, not only when the first bonding part non-bonding (bonding failure) is detected, but also when bump-part non-bonding is detected, the capillary is caused to descend, thus bonding the non-bonded bump to the second bond point. Thus, the productivity is enhanced.

Furthermore, in the present invention, the detection of first bonding part non-bonding is conducted either during the ascending movement of the capillary toward the reverse starting point or when the capillary has ascended to the reverse starting point. Accordingly, upon detection of non-bonding, the non-bonded first bonding part is immediately bonded to the first bond point merely by the descending movement of the capillary.

Furthermore, in the present invention, if non-bonding is repeatedly detected, the wire bonding apparatus is stopped, so that reworking of bonding can be made on the defective products on which any non-bonding (bonding failure) has been detected and/or removing of the defective products on which any non-bonding (bonding failure) has been detected can be made, preventing unnecessary non-bonding detections.

U.S. Pat. Nos. 5,058,797 and 5,201,454 are herein incorporated by reference.

DETAILED DESCRIPTION OF THE INVENTION

The wire bonding method of the first embodiment will be described with reference to FIG. 1.

The first embodiment is for overcoming the bonding failure (s) that occurs in the wire bonding method shown in FIG. 4, in which the non-bonding (bonding failure) would be at the first bonding part 12. Accordingly, the description of the method of FIG. 1 will be made relative to FIG. 4, and the same elements in FIGS. 1 and 4 are given the same reference numerals.

Figure 1:
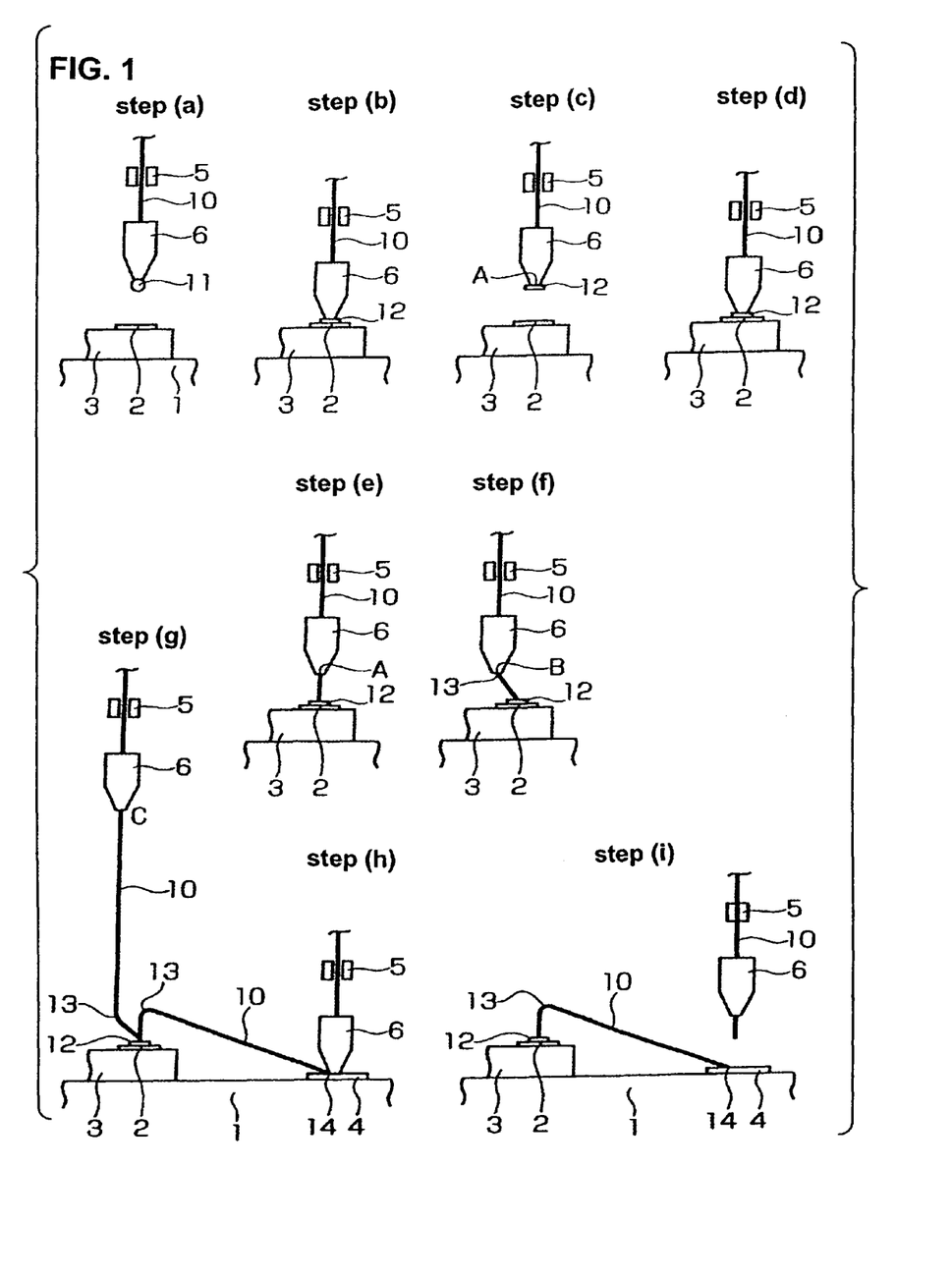
FIG. 1 is a process diagram showing the steps of the first embodiment of the wire bonding method according to the present invention.

Steps (a) and (b) in FIG. 1 correspond, respectively, to steps (a) and (b) of FIG. 4, while steps (e) to (i) of FIG. 1 correspond, respectively, to steps (c) to (g) of FIG. 4. In other words, the method of FIG. 1 includes additional steps (c) and (d) between steps (b) and (c) shown in FIG. 4 for overcoming the non-bonding (bonding failure) occurring to the first bonding part 12.

In step (a) of FIG. 1 (or in the corresponding step (a) of FIG. 4), a ball 11 is formed by an electric torch (not shown) at the tip end of a bonding wire (called "wire") 10 that passes through the clamper 5 and further passes through the capillary 6, after which the clamper 5 is opened.

Next, in step (b) (or in step (b) of FIG. 4), the capillary 6 is caused to descend and bonds the ball 11 to the pad 2 that is the first bond point, thus forming the first bonding part 12.

Next, in step (c), the capillary 6 is caused to ascend as far as the reverse starting point A, trying to pay out the wire 10. A non-bonding (bonding failure) detection at the first bonding part 12 is performed during this ascending motion of the capillary 6 toward the reverse starting point A, or it can be performed when the capillary 6 has ascended to the reverse starting point A. In other words, it is detected if the ball 11 is bonded to the pad 2 as a first bonding part 12.

This detection is performed by, for instance, the method described Japanese Patent Application Laid-Open (Kokai) Nos. H7-94545 (Japanese Patent No. 3,041,812) or 2003-347369. For instance, the detection can be performed using a wire bonding apparatus having a bonding wire feeding means, a capillary for the bonding wire and a clamper, in which the clamper is comprised of an electrical connection clamper which is for a bonding wire and is installed upstream of a bonding wire cutting clamper, and the electrical connection clamper for the bonding wire is electrically connected to a faulty wire connection detection power supply.

If the first bonding part 12 is not non-bonded or is successfully bonded, then the step advances to the next step as in step (d) of FIG. 4 or to step (f) of FIG. 1. However, when non-bonding (bonding failure) of the first bonding part 12 is detected or if it is detected or found that the first bonding part 12 is not bonded to the pad 2, thus the bonding is unsuccessfully and the first bonding part 12 has peeled away from the pad 2 as shown in step (c) of FIG. 1, then the capillary 6 is caused again to descend in step (d), thus bonding the first bonding part 12 to the pad 2.

Then, the capillary 6 is caused to ascend in step (e) as far as the reverse starting point A, paying out the wire 10. While the capillary 6 is moved up and to the reverse starting point A or when it has ascended to the reverse starting point A, non-bonding detection for the first bonding part 12 is performed as described above. When first bonding part 12 non-bonding is again detected, then the bonding apparatus executing the boding method is stopped. When the first bonding part 12 is successfully bonded thus being not in non-bonded situation, the process of step (f) and any successive steps are performed thereafter (or the step (d) and successive steps of FIG. 4 are performed thereafter as in the conventional method)

More specifically, in step (f), a reverse movement is effected, causing the capillary 6 to move horizontally or parallel to the circuit board 1 as far as the bend formation point B in a direction opposite from the interconnect wiring 4 that is the second bond point. As a result, the wire 10 takes on a shape such that it inclines from the first bonding part 12 to the bend formation point B, and a bent part 13 touches the bend formation point B portion.

In the next step (g), the capillary 6 is caused to ascend as far as the loop top point C, paying out the wire 10.

After the step (g), the capillary 6 is moved in step (h) to directly above the interconnect wiring 4 that is the second bond point, after which it is caused to descend, bonds the wire 10 to the interconnect wiring 4, and makes it the second bonding part 14.

In step (i), the clamper 5 and capillary 6 are caused to ascend together, during which the clamper 5 closes, and the wire 10 is cut at the base of the second bonding part 14, thus completing the connection of the rust bond point and the second bond point with the wire, thereby forming a triangular loop, as a typical case, exemplary wire loop shape can be found in U.S. Pat. No. 4,327,860, the disclosure of which is hereby incorporated by reference.

As seen from the above, when first bonding part 12 is not bonded and non-bonding is detected, instead of stopping the bonding apparatus executing the bonding, the capillary 6 is caused again to descend and bond the first bonding part 12 to the pad 2 that is the first bond point. Accordingly, the productivity is enhanced and high. The detection of the first bonding part 12 non-bonding (or bonding failure) is performed while the capillary 6 is ascending toward the reverse starting point A or when it has ascended to the reverse starting point A. Accordingly, when non-bonding (bonding failure) of the first bonding part 12 to the pad 2 that is the first bond point is detected, the first bonding part 12 is immediately re-bonded to the pad 2 by making a descending movement of the capillary 6. Furthermore, when non-bonding is detected twice or repeatedly, then the operation of the wire bonding apparatus is stopped, so that reworking of bonding can be made on the defective products on which any non-bonding (bonding failure) has been detected and/or removing of the defective products on which any non-bonding (bonding failure) has been detected can be made, preventing unnecessary non-bonding detections.

The wire bonding method of the second embodiment will be described with reference to FIG. 2, FIG. 3, and FIG. 5.

Figure 2:
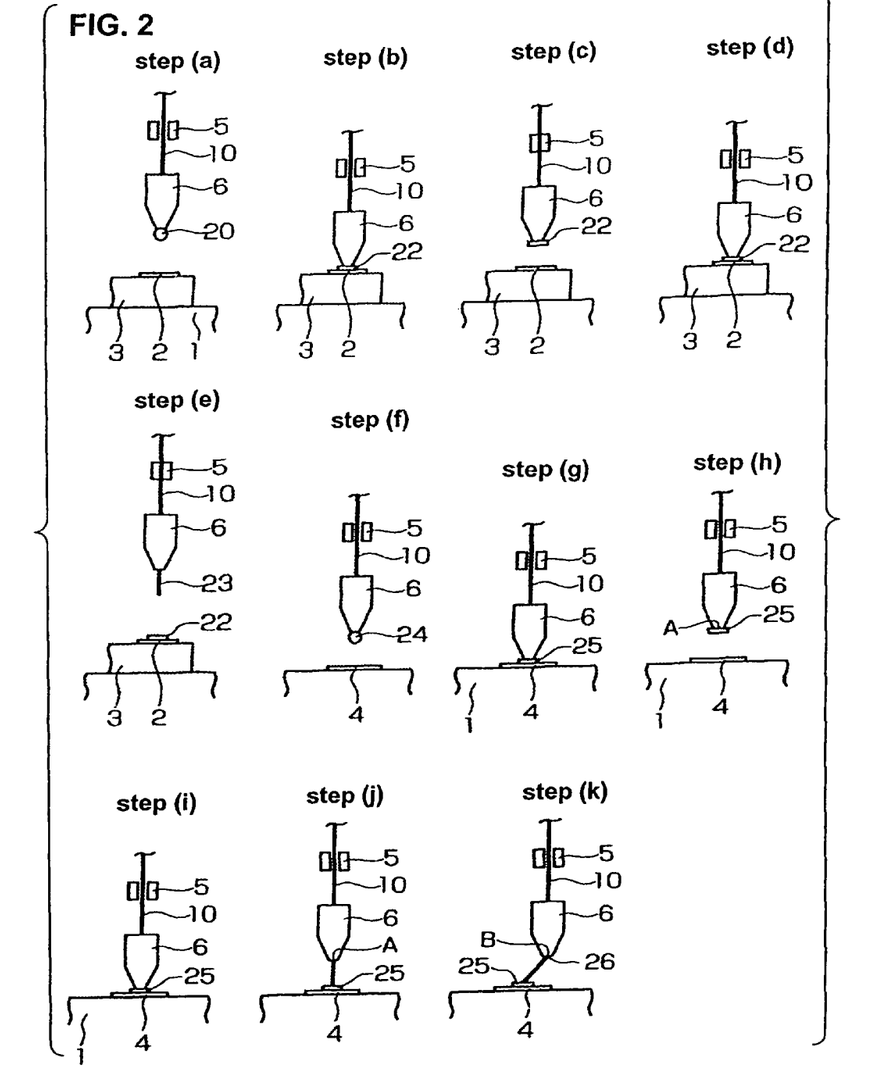
FIG. 2 is a process diagram showing the steps of the second embodiment of the wire bonding method according to the present invention.
Figure 3:
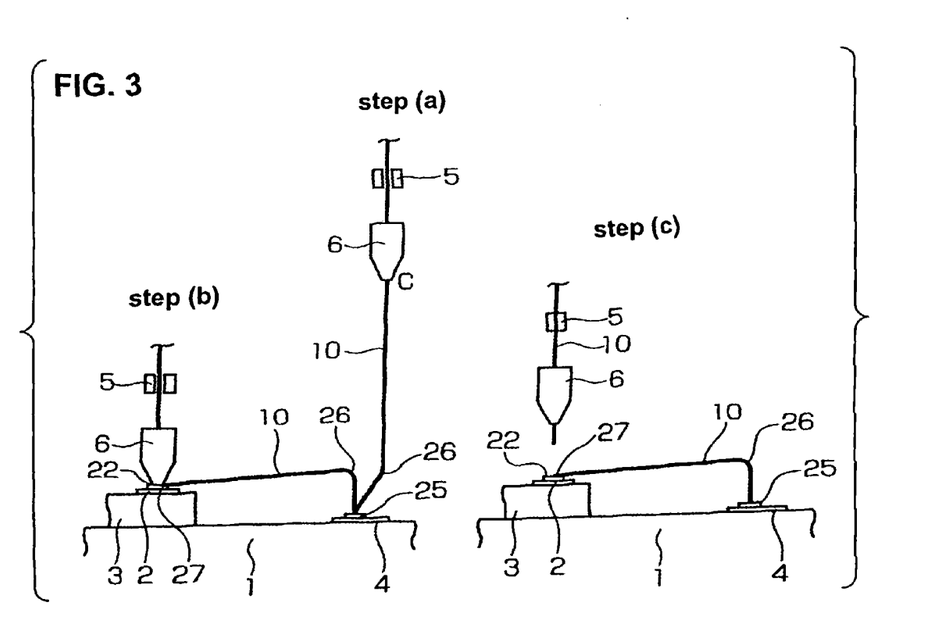
FIG. 3 shows steps that are the continuation of the steps of FIG. 2.

The second embodiment shown in FIGS. 2 and 3 is for overcoming the bonding failure(s) that occurs in the wire bonding method shown in FIG. 5, in which the non-bonding (bonding failure) would be at the bump 22 and/or at the first bonding part 25. Accordingly, the description of the method of FIGS. 2 and 3 will be made relative to FIG. 5, and the same elements in FIGS. 2, 3 and 5 are given the same reference numerals.

Steps (a) and (b) in FIG. 2 correspond, respectively, to steps (a) and (b) of FIG. 5, steps (e) to (g) of FIG. 2 correspond, respectively, to steps (c) to (e) of FIG. 5, steps (j) and (k) of FIG. 2 correspond, respectively, to steps (f) and (g) of FIG. 5, and steps (a), (b) and (c) of FIG. 3 correspond, respectively, to steps (h), (i), and (j) of FIG. 5. In other words, the method of FIGS. 2 and 3 includes additional steps (c) and (d) shown in FIG. 2 between steps (b) and (c) of FIG. 5 for overcoming the bonding failure occurring to the bump 22 and further includes steps (h) and (i) of FIG. 2 between steps (e) and (f) of FIG. 5 for overcoming the bonding failure occurring to the first bonding part 25.

First, in step (a) of FIG. 2 (or in the corresponding step (a) of FIG. 5), a ball (first ball) 20 is formed by an electric torch (not shown) at the tip end of a wire 10 that passes through the clamper 5 and further passes through the capillary 6, after which the clamper 5 is opened.

Next, in step (b) (or in step (b) of FIG. 5), the capillary 6 is caused to descend and bonds the ball 20 to the pad 2 that is the second bond point, thus forming a bump 22 (see step (b) of FIG. 5).

After the step (b), the clamper 5 and capillary 6 are caused to ascend together; and during this ascending movement, the clamper 5, which has been opened, is closed, thus allowing the wire to be cut and leaving the bump 22 on the pad 2 (see step (c) of FIG. 5). From the moment that the clamper 5 is closed, the clamper 5 and the capillary 6 are in a status of being further ascended. Step (c) in FIG. 2 shows the status immediately after the clamper 5 has closed and the wire 10 is cut. In other words, step (c) of FIG. 2 diagrams a status wherein the capillary 6 has ascended slightly higher than the tail 23.

A non-bonding (bonding failure) detection of the bump 22 to the pad 2 is performed when the clamper 5 is closed or when it is opened.

This detection is performed by, for instance, the method described in at least one of U.S. Pat. No. 5,058,797, Japanese Patent Application Laid-Open (Kokai) No. 11-191564 or 2000-306940. For instance, detection can be made using a computer so that within the time period after a ball at the end of a bonding wire is bonded to an object and before the wire is cut at the base of the ball, power sources applying the voltage to the wire and the voltage changes during the time period described above depending upon bonding or non-bonding of the ball are detected, thus making a judgment if the ball has been bonded an become a bump or not.

If the bump is formed on the pad 2 (see bump 22 in step (c) of FIG. 5) and the bump formation is thus successfully done on the pad 2, the process advances to the next step as in step (d) of FIG. 5 or to step (f) of FIG. 2. However, if a bump 22 non-bonding is detected and the bump 22 remains on the wire 10 as seen in step (c) of FIG. 2, in other words, if it is detected or found that the bump 22 has peeled away from the pad 2 to stay on the wire 10, then the capillary 6 is caused again to descend in step (d) and bonds the peeled-off bump 22 to the pad 2.

Then, the clamper 5 and capillary 6 are caused to ascend together, and the clamper 5 is closed during this ascending movement or remains opened, and bump non-bonding detection is again performed in the same manner as described above. If the bump non-bonding is again detected, then the bonding apparatus executing the bonding method is stopped. If, however, the bump 22 is successfully formed on the pad 2 and no non-bonded situation occurs, the process of step (e) and any successive steps are performed thereafter (or the step (d) and successive steps of FIG. 5 are performed thereafter as in the conventional method).

More specifically, in step (f), a ball (second ball) 24 is formed by an electric torch (not shown) at the tip end of the tail 23 of the wire 10, after which the clamper 5 is opened, and it is moved over the interconnect wiring 4 that is the first bond point.

In the next step (g), the capillary 6 is caused to descend, bonds the ball 24 to the interconnect wiring 4 that is the first bond point, thus forming the first bonding part 25.

In the next step, as seen from step (f) of FIG. 5, the capillary 6 is caused to ascend to as far as the reverse starting point A, trying to pay out the wire 10; and a non-bonding (bonding failure) detection at the first bonding part 25 is performed during this ascending movement of the capillary 6 toward the reverse starting point A, or the non-bonding (bonding failure) detection can be performed when the capillary 6 has ascended to the reverse starting point A.

This detection is performed by, for instance, the method described Japanese Patent Application Laid-Open (Kokai) Nos. H7-94545 (Japanese Patent No. 3,041,812) or 2003-347369. For instance, the detection can be performed using a wire bonding apparatus having a bonding wire feeding means, a capillary for the bonding wire and a clamper means, in which the clamper means is comprised of an electrical connection clamper for a bonding wire installed upstream of a bonding wire cutting clamper, and the electrical connection clamper for the bonding wire is electrically connected to a faulty wire connections detection power supply.

If the first bonding part 25 is not non-bonded or is successfully bonded, then the step advances to the next step, so that step (g) and successive steps shown in FIG. 5 are performed as conventionally. However, if non-bonding (bonding failure) of the first bonding part 25 is detected or if it is detected or found that the first bonding part 25 is not bonded to the interconnect wiring 4, and the first bonding part 25 has peeled away from the interconnect wiring 4 as seen in step (h) of FIG. 2, then the capillary 6, in step (i), is caused again to descend and bonds the first bonding part 25 to the interconnect wiring 4.

In the next step (j), the capillary 6 is caused to ascend as far as the reverse starting point A, paying out the wire 10. A non-bonding detection is performed for the first bonding part 25 again performed in the same manner as described above, either while the capillary 6 is ascending toward the reverse starting point A or when the capillary 6 has ascended to the reverse starting point A. If first bonding part 25 non-bonding (bonding failure) is again detected, then the bonding apparatus executing the bonding method is stopped. If the first bonding part 25 is not non-bonded and the bonding thereof to the interconnect wiring 44 has been successfully done, then the process advances to step (k) and steps (a) through (c) of FIG. 3, which are equivalent to steps (i) through (j) of FIG. 5, are performed thereafter.

More specifically, in step (k), a reverse movement of the capillary 6 is effected that causes the capillary 6 to move horizontally or parallel to the circuit board 1 as far as the bend formation point B in a direction opposite from the pad 2 that is the second bond point, the wire 10 takes on a shape such that it inclines from the first bonding part 25 to the bend formation point B, and a bent part 26 is formed at the bend formation point B.

Next, in (a) of FIG. 3, the capillary 6 is caused to ascend as far as the loop top point C, paying out the wire 10.

Thereafter, in step (b), the capillary 6 is moved to directly above the pad 2 that is the second bond point, then is caused to descend, bonds the wire 10 to the bump 22 on the pad 2, and makes it a second bonding part 27.

Next, the clamper 5 and capillary 6 are caused to ascend together in step (c) of FIG. 3, the clamper 5 is closed during this ascending movement, cutting the wire 10 at the base of the second bonding part 27, thus completing the connection of the first bond point and the second bond point with the wire.

As seen from the above, when the bonding failure of the first bonding part 25 is detected, instead of stopping the bonding apparatus, the capillary 6 is caused again to descend and bond the non-bonded first bonding part 25 to the interconnect wiring 4 that is the first bond point. Accordingly, the productivity is enhanced and high. Moreover, in addition to this first bonding part 25 non-bonding, when the bonding failure of the bump 22 is detected, the capillary 6 is caused again to descend and bond the bump 22 to the pad 2 that is the second bond point. Accordingly, again, the productivity is enhanced and high.

Furthermore, the first bonding part 25 non-bonding detection is performed during the ascending movement of the capillary 6 toward the reverse starting point A, or when it has ascended to the reverse starting point A; accordingly, when the bonding failure of the first bonding part 25 to the interconnect wiring 4 is detected, the non-bonded first bonding part 25 is bonded immediately to the interconnect wiring 4 merely by descending the capillary 6. Furthermore, when non-bonding is detected twice or repeatedly, then the operation of the wire bonding apparatus is stopped, so that reworking of bonding can be made on the defective products on which any non-bonding (bonding failure) has been detected and/or removing of the defective products on which any non-bonding (bonding failure) has been detected can be made, preventing unnecessary non-bonding detections

The invention claimed is:

1. A method of bonding a first bond point to a second bond point with a wire per bonding cycle, utilizing a wire bonding apparatus, the method comprising:
   a first bonding step;
   an examination and re-bonding step;
   a looping step; and
   a second bonding step;
   wherein the method to continuously perform a cycle of bonding steps of:
      the first bonding step of, before the examination and re-bonding step, bonding a ball formed at a tip end of a capillary to the first bond point by causing the capillary to descend, thereby forming a first bonding part to the first bond point;

the examination and re-bonding step of, between after the first bonding step and before the looping step, examining whether the first bonding part is bonded to the first bond point while ascending the capillary to a reverse starting point when the first bonding part fails to be bonded thereto, re-bonding the non-bonded first bonding part formed at the tip end of the capillary to the first bond point by causing the capillary to descend or when the first bonding part has been completed thereto, no re-bonding to the first bonding point;

the looping step of, between after the examination and re-bonding step and before the second bonding step, causing the capillary to move horizontally as far as a bend formation point in a direction opposite from the second bond point, then causing the capillary to ascend as far as a loop top point while paying out the wire, and then causing the capillary to move to directly above the second bond point; and the second bonding step of, after the looping step, bonding the wire to the second bond point while causing the capillary to descend thereto, thereby forming a second bonding part on the second bond point, thus connecting the first bond point and the second bond point with wire without stopping the wire bonding apparatus executing each of bonding steps.

2. A method of bonding a first bond point that is an interconnect wiring and a second bond point that is a pad with a wire per bonding cycle, utilizing a wire bonding apparatus, the method comprising:

a bump forming step;

an examination and re-bonding step in the bump forming step;

a first bonding step;

an examination and re-bonding step in the first bonding step;

a looping step; and a second bonding step;

wherein the method to continuously perform a cycle of bonding steps of:

the bump forming step of, before the examination and re-bonding step in the bump forming step, forming a bump to the second bond point in such a manner that a first ball formed at a tip end of a capillary is bonded to the second bond point by causing the capillary to descend and to ascend while cutting the wire, thereby forming a bump to the second bonding points;

the examination and re-bonding step in the bump forming step of, between after the bump forming step and before the first bonding step, examining whether the bump is bonded to the second bond point before the wire is cut to form the bump while ascending the capillary to the predetermined height, when the bump fails to be bonded thereto, re-bonding non-bonded bump formed at the tip end of the capillary to the second bond point or when the bump has been completed thereto, no re-bonding to the second bonding point;

the first bonding step of, between after the examination and re-bonding step in the bump forming step and before the examination and re-bonding step in the first bonding step, bonding a second ball formed at a tip end of a tail of the wire of the capillary to the first bond point by causing the capillary to descend, thereby forming a first bonding part on the first bond point;

the examination and re-bonding step in the first bonding step, between after the first bonding step and before the looping step, examining whether the first bonding part is bonded to the first bond point while ascending the capillary to a reverse starting point, when the first bonding part fails to bond thereto, re-bonding the non-bonded first bonding part to the first bond point by causing the capillary to descend or when the first bonding part has been completed thereto, no re-bonding to the first bonding point;

the looping step, between after the examination and re-bonding step before the second bonding step, causing the capillary to move horizontally as far as a bend formation point in a direction opposite from the second bond point, then causing the capillary to ascend as far as a loop top point while paying out the wire, and then causing the capillary to move to directly above the second bond point; and the second bonding step of, after the looping step, bonding the wire to the bump on the second bond point while causing the capillary to descend thereon, thereby forming a second bonding part to the second bond point, thus connecting the first bond point and the second bond point with the wire without stopping the wire bonding apparatus executing each of bonding steps.

3. The method according to claim 1, wherein the examination of the first bonding part is conducted either while the capillary is ascending toward the reverse starting point or when the capillary has ascended to the reverse starting point.

4. The method according to claim 1, wherein, when the examination detects repeatedly that the first bonding part fails to be bonded to the first bond part, then a wire bonding apparatus executing the bonding method is stopped.

5. The method according to claim 2, wherein, when the examination detects repeatedly that the bump is not bonded to the pad, then a wire bonding apparatus executing the bonding method is stopped.

6. The method according to claim 2, wherein the examination of the first bonding part is conducted either while the capillary is ascending toward the reverse starting point or when the capillary has ascended to the reverse starting point.

7. The method according to claim 2, wherein, when the examination detects repeatedly that the first bonding part is not bonded to the first bond part, then a wire bonding apparatus executing the bonding method is stopped.

8. A wire bonding method of sequentially bonding a wire with making an electrical connection from a first bonding point to a second bonding point with a capillary through that the wire is inserted, the bonding method comprising:

a discharging step;

a bonding step;

a detecting and re-bonding step; and a looping step;

wherein the wire bonding method to continuously perform a cycle of steps of:

the discharging step of, before the bonding step, discharging an electrical discharge from an electrical torch to a tail of a wire paid out from the capillary by applying a high voltage, so that the electrical discharge is caused to take place, thereby forming a ball on the tail of the wire at a predetermined location;

the bonding step of, between after the discharging step and before the detecting and re-bonding step, bonding the ball onto the first bonding point by descending the capillary;

the detecting and re-bonding step of, between after the bonding step and before the looping step, detecting whether or not the ball is bonded on the first bonding point, by means of a detector, by applying minute electrical current to the wire in the state that the wire connects to the first bonding point while ascending the capillary to a reverse starting point when the first bonding point fails to be bonded thereto, re-bonding the ball onto the first bonding point by descending the capillary, then ascending the capillary to the reverse starting point or when the first bonding point has been completed thereto, no re-bonding the ball onto the first bonding point; and the looping step of, after the detecting and re-bonding step when the first bonding point is bonded thereto, moving the capillary horizontally as far as a bend formation point in a direction opposite from the second bond point, then ascending the capillary as far as a loop top point while paying out the wire, then moving the capillary to directly above the second bond point, and then bonding the looped wire onto the second bonding point, thus connecting the first bonding point and the second bonding point with wire without stopping each of bonding steps.

9. The method according to claim 8, wherein a wire bonding apparatus executing the bonding method is stopped in the case of where the detector detects repeatedly that the ball is not bonded on the first bonding point.

10. A wire bonding method of sequentially bonding a wire with making an electrical connection from a first bonding point to a second bonding point with a capillary through that the wire is inserted, the bonding method comprising:
a discharging step;
a second bonding step;
a detecting and re-bonding step of the second bonding point;
a cutting step;
a discharging step;
a first bonding step;
a detecting and re-bonding step of the first bonding point; and
a looping step,
wherein the wire bonding method to continuously perform a cycle of steps of:
the discharging step of, before the second bonding step, discharging an electrical discharge from an electrical torch to a tail of a wire paid out from the capillary by applying a high voltage, so that the electrical discharge is caused to take place, thereby forming a ball on the tail off the wire at a predetermined location;
the second bonding step of between after the discharging step and before the detecting and re-bonding step of the second bonding point, bonding the ball onto the second bonding point by descending the capillary;
the detecting and re-bonding step of the second bonding point, between after the second bonding step and before the cutting step, detecting whether or not the ball is bonded on the second bonding point, by means of a detector, by applying minute electrical current to the wire in the state that the wire connects to the second bonding point while ascending the capillary to the predetermined location when the second bonding point fails to be bonded thereto, re-bonding the ball onto the second bonding point by descending the capillary, then ascending the capillary to the predetermined location or when the second bonding point has been completed thereto, no re-bonding the ball onto the second bonding point;

the cutting step of between after the detecting and re-bonding step of the second bonding point and before the discharging step, cutting the wire in the case of detecting a bonded state of the ball on the second bonding point with the detector while ascending the capillary to the predetermined location, thereby forming a bump on the second bonding point;

the discharging step of, between after the cutting step and before the first bonding step, discharging the electrical discharge from the electrical torch to the tail of the wire paid out from the capillary by applying a high voltage, so that the electrical discharge is caused to take place, thereby forming the ball on the tail off the wire at a predetermined location;

the first bonding step of, between after the discharging step and before the detecting and re-bonding step of the first bonding point, bonding the ball onto the first bonding point by descending the capillary;

the detecting and re-bonding step of the first bonding point, between after the first bonding step and the looping step, detecting whether or not the ball is bonded on the first bonding point, by means of the detector by applying minute electrical current to the wire in the state that the wire connects to the first bonding point while ascending the capillary to a reverse starting point when the first bonding point fails to be bonded thereto, re-bonding the ball onto the first bonding point by descending the capillary, then ascending the capillary to the reverse starting point or when the first bonding point has been completed thereto, no re-bonding the ball onto the first bonding point; and the looping step of, after the detecting and re-bonding step of the first bonding point, looping the wire by causing the capillary to move horizontally as far as a bend formation point in a direction opposite from the second bond point, then ascending the capillary as far as a loop top point while paying out the wire, then moving the capillary to directly above the bump on the second bond point, and then bonding the looped wire onto the bump on the second bonding point, thus connecting the first bonding point and the second bonding point with wire without stopping the wire bonding apparatus executing each of bonding steps.

11. The method according to claim 10, wherein the first bonding point is an interconnect wiring and the second bonding point is a pad.

12. The method according to claim 10, wherein a wire bonding apparatus executing the bonding method is stopped in the case of detecting the repeatedly non-bonded state of the ball on the first bonding point.

13. The method according to claim 10, wherein a wire bonding apparatus executing the bonding method is stopped in the case of detecting the repeatedly non-bonded state of the bump on the second bonding point.

14. A method of bonding a first bond point to a second bond point with a wire per bonding cycle, utilizing a wire bonding apparatus, the method comprising:
a first bonding step;
an examination and re-bonding step;
a looping step; and
a second bonding step;
wherein the method to continuously perform a cycle of bonding steps of:

the first bonding step of, before the examination and re-bonding step, bonding a ball formed at a tip end of a capillary to the first bond point by causing the capillary to descend, thereby forming a first bonding part to the first bond point;

the examination and re-bonding step of, between after the first bonding step and before the looping step, examining whether the first bonding part is bonded to the first bond point while ascending the capillary to a reverse starting point when the first bonding part fails to be bonded thereto, re-bonding the non-bonded first bonding part formed at the tip end of the capillary to the first bond point by causing the capillary to descend or when the first bonding part has been completed thereto, no re-bonding to the first bonding point;

the looping step of, between after the examination and re-bonding step and before the second bonding step, causing the capillary to move horizontally as far as a bend formation point in a direction opposite from the second bond point, then causing the capillary to ascend as far as a loop top point while paying out the wire, and then causing the capillary to move to directly above the second bond point; and the second bonding step of, after the looping step, bonding the wire to the second bond point while causing the capillary to descend thereto, thereby forming a second bonding part on the second bond point, thus connecting the first bond point and the second bond point with wire without stopping the wire bonding apparatus executing each of bonding steps;

wherein the examination of the first bonding part is conducted either while the capillary is ascending toward the reverse starting point or when the capillary has ascended to the reverse starting point; and wherein, when the examination detects repeatedly that the first bonding part fails to be bonded to the first bond part, then a wire bonding apparatus executing the bonding method is stopped.

15. A method of bonding a first bond point that is an interconnect wiring and a second bond point that is a pad with a wire per bonding cycle, utilizing a wire bonding apparatus, the method comprising:
a bump forming step;
an examination and re-bonding step in the bump forming step;
a first bonding step;
an examination and re-bonding step in the first bonding step;
a looping step; and
a second bonding step;
wherein the method to continuously perform a cycle of bonding steps of:
the bump forming step of, before the examination and re-bonding step in the bump forming step, forming a bump to the second bond point in such a manner that a first ball formed at a tip end of a capillary is bonded to the second bond point by causing the capillary to descend and to ascend while cutting the wire, thereby forming a bump to the second bonding points;
the examination and re-bonding step in the bump forming step of, between after the bump forming step and before the first bonding step, examining whether the bump is bonded to the second bond point before the wire is cut to form the bump while ascending the capillary to the predetermined height, when the bump fails to be bonded thereto, re-bonding non-bonded bump formed at the tip end of the capillary to the second bond point or when the bump has been completed thereto, no re-bonding to the second bonding point;

the first bonding step of, between after the examination and re-bonding step in the bump forming step and before the examination and re-bonding step in the first bonding step, bonding a second ball formed at a tip end of a tail of the wire of the capillary to the first bond point by causing the capillary to descend, thereby forming a first bonding part on the first bond point;

the examination and re-bonding step in the first bonding step, between after the first bonding step and before the looping step, examining whether the first bonding part is bonded to the first bond point while ascending the capillary to a reverse starting point, when the first bonding part fails to bond thereto, re-bonding the non-bonded first bonding part to the first bond point by causing the capillary to descend or when the first bonding part has been completed thereto, no re-bonding to the first bonding point;

the looping step, between after the examination and re-bonding step before the second bonding step, causing the capillary to move horizontally as far as a bend formation point in a direction opposite from the second bond point, then causing the capillary to ascend as far as a loop top point while paying out the wire, and then causing the capillary to move to directly above the second bond point; and the second bonding step of, after the looping step, bonding the wire to the bump on the second bond point while causing the capillary to descend thereon, thereby forming a second bonding part to the second bond point, thus connecting the first bond point and the second bond point with the wire without stopping the wire bonding apparatus executing each of bonding steps;

wherein the examination of the first bonding part is conducted either while the capillary is ascending toward the reverse starting point or when the capillary has ascended to the reverse starting point;

wherein, when the examination detects repeatedly that the bump is not bonded to the pad, then a wire bonding apparatus executing the bonding method is stopped; and wherein, when the examination detects repeatedly that the first bonding part is not bonded to the first bond part, then a wire bonding apparatus executing the bonding method is stopped.

16. A wire bonding method of sequentially bonding a wire with making an electrical connection from a first bonding point to a second bonding point with a capillary through that the wire is inserted, the bonding method comprising:
a discharging step;
a bonding step;
a detecting and re-bonding step; and
a looping step;
wherein the wire bonding method to continuously perform a cycle of steps of:
the discharging step of, before the bonding step, discharging an electrical discharge from an electrical torch to a tail of a wire paid out from the capillary by applying a high voltage, so that the electrical discharge is caused to take place, thereby forming a ball on the tail of the wire at a predetermined location;
the bonding step of, between after the discharging step and before the detecting and re-bonding step, bonding the ball onto the first bonding point by descending the capillary;

the detecting and re-bonding step of, between after the bonding step and before the looping step, detecting whether or not the ball is bonded on the first bonding point, by means of a detector, by applying minute electrical current to the wire in the state that the wire connects to the first bonding point while ascending the capillary to a reverse starting point when the first bonding point fails to be bonded thereto, re-bonding the ball onto the first bonding point by descending the capillary, then ascending the capillary to the reverse starting point or when the first bonding point has been completed thereto, no re-bonding the ball onto the first bonding point; and the looping step of, after the detecting and re-bonding step when the first bonding point is bonded thereto, moving the capillary horizontally as far as a bend formation point in a direction opposite from the second bond point, then ascending the capillary as far as a loop top point while paying out the wire, then moving the capillary to directly above the second bond point, and then bonding the looped wire onto the second bonding point, thus connecting the first bonding point and the second bonding point with wire without stopping each of bonding steps;

wherein a wire bonding apparatus executing the bonding method is stopped in the case of where the detector detects repeatedly that the ball is not bonded on the first bonding point.

17. A wire bonding method of sequentially bonding a wire with making an electrical connection from a first bonding point to a second bonding point with a capillary through that the wire is inserted, the bonding method comprising:

a discharging step;
a second bonding step;
a detecting and re-bonding step of the second bonding point;
a cutting step;
a discharging step;
a first bonding step;
a detecting and re-bonding step of the first bonding point; and
a looping step,
wherein the wire bonding method to continuously perform a cycle of steps of:

the discharging step of before the second bonding step, discharging an electrical discharge from an electrical torch to a tail of a wire paid out from the capillary by applying a high voltage, so that the electrical discharge is caused to take place, thereby forming a ball on the tail off the wire at a predetermined location;

the second bonding step of, between after the discharging step and before the detecting and re-bonding step of the second bonding point, bonding the ball onto the second bonding point by descending the capillary;

the detecting and re-bonding step of the second bonding point, between after the second bonding step and before the cutting step, detecting whether or not the ball is bonded on the second bonding point, by means of a detector, by applying minute electrical current to the wire in the state that the wire connects to the second bonding point while ascending the capillary to the predetermined location when the second bonding point fails to be bonded thereto, re-bonding the ball onto the second bonding point by descending the capillary, then ascending the capillary to the predetermined location or when the second bonding point has been completed thereto, no re-bonding the ball onto the second bonding point;

the cutting step of, between after the detecting and re-bonding step of the second bonding point and before the discharging, step, cutting the wire in the case of detecting a bonded state of the ball on the second bonding point with the detector while ascending the capillary to the predetermined location, thereby forming a bump on the second bonding point;

the discharging step of, between after the cutting step and before the first bonding step, discharging the electrical discharge from the electrical torch to the tail of the wire paid out from the capillary by applying a high voltage, so that the electrical discharge is caused to take place, thereby forming the ball on the tail off the wire at a predetermined location;

the first bonding step of, between after the discharging step and before the detecting and re-bonding step of the first bonding point, bonding the ball onto the first bonding point by descending the capillary;

the detecting and re-bonding step of the first bonding point, between after the first bonding step and the looping step, detecting whether or not the ball is bonded on the first bonding point, by means of the detector by applying minute electrical current to the wire in the state that the wire connects to the first bonding point while ascending the capillary to a reverse starting point when the first bonding point fails to be bonded thereto, re-bonding the ball onto the first bonding point by descending the capillary, then ascending the capillary to the reverse starting point or when the first bonding point has been completed thereto, no re-bonding the ball onto the first bonding point; and the looping step of, after the detecting and re-bonding step of the first bonding point, looping the wire by causing the capillary to move horizontally as far as a bend formation point in a direction opposite from the second bond point, then ascending the capillary as far as a loop top point while paying out the wire, then moving the capillary to directly above the bump on the second bond point, and then bonding the looped wire onto the bump on the second bonding point, thus connecting the first bonding point and the second bonding point with wire without stopping the wire bonding apparatus executing each of bonding steps;

wherein the first bonding point is an interconnect wiring and the second bonding point is a pad;

wherein a wire bonding apparatus executing the bonding method is stopped in the case of detecting the repeatedly non-bonded state of the ball on the first bonding point; and wherein a wire bonding apparatus executing the bonding method is stopped in the case of detecting the repeatedly non-bonded state of the bump on the second bonding point.

* * * * *